(12) United States Patent
Shi

(10) Patent No.: US 9,602,804 B2
(45) Date of Patent: Mar. 21, 2017

(54) METHODS OF FORMING INTEGRATED PACKAGE STRUCTURES WITH LOW Z HEIGHT 3D CAMERA

(71) Applicant: Intel Corporation, Santa Clara, CA (US)

(72) Inventor: Wei Shi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/669,877

(22) Filed: Mar. 26, 2015

(65) Prior Publication Data

US 2016/0284752 A1    Sep. 29, 2016

(51) Int. Cl.
*H04N 5/225* (2006.01)
*H04N 13/02* (2006.01)
*H01L 27/146* (2006.01)
*H01L 31/0232* (2014.01)

(52) U.S. Cl.
CPC ... *H04N 13/0203* (2013.01); *H01L 27/14618* (2013.01); *H01L 27/14625* (2013.01); *H01L 27/14683* (2013.01); *H01L 31/02325* (2013.01)

(58) Field of Classification Search
CPC .......... H04N 13/0203; H01L 27/14627; H01L 27/14683; H01L 31/02325
See application file for complete search history.

(56) References Cited

U.S. PATENT DOCUMENTS

| 2001/0030682 | A1 | 10/2001 | Tserkovnyuk et al. | |
| 2003/0218251 | A1* | 11/2003 | Seo | H01L 27/14618 257/737 |
| 2005/0046740 | A1* | 3/2005 | Davis | H04N 5/2254 348/373 |
| 2008/0001241 | A1* | 1/2008 | Tuckerman | H01L 31/0203 257/434 |
| 2010/0314703 | A1* | 12/2010 | Chen | H01L 27/14618 257/432 |
| 2010/0321558 | A1* | 12/2010 | Chiu | G01S 11/12 348/360 |

(Continued)

FOREIGN PATENT DOCUMENTS

| EP | 2455984 A2 | 5/2012 |
| WO | 2010-007594 A1 | 1/2010 |

OTHER PUBLICATIONS

International Search Report and Written Opinion received for International Application No. PCT/US2016/019556, mailed on Jul. 15, 2016, 13 pages.

(Continued)

*Primary Examiner* — Aung S Moe
*Assistant Examiner* — John H Morehead, III
(74) *Attorney, Agent, or Firm* — Alpine Technology Law Group LLC

(57) ABSTRACT

Methods of forming 3D camera devices and structures formed thereby are described. An embodiment includes a first optics module and a second optics module disposed on a board, wherein a first sensor die is coupled to the first optics module and a second sensor die is coupled to the second optics module. The first and second sensor die are directly coupled to the board, and a flexible conductive connector is coupled to both the first and second optics modules.

24 Claims, 9 Drawing Sheets

(56) References Cited

U.S. PATENT DOCUMENTS

| | | | |
|---|---|---|---|
| 2011/0038065 A1* | 2/2011 | Miyawaki | G02B 7/021 |
| | | | 359/819 |
| 2011/0069189 A1* | 3/2011 | Venkataraman | H01L 27/14618 |
| | | | 348/218.1 |
| 2011/0273600 A1* | 11/2011 | Kriman | H01L 27/14618 |
| | | | 348/294 |
| 2012/0181646 A1 | 7/2012 | Han et al. | |
| 2014/0264693 A1* | 9/2014 | Oganesian | H01L 24/95 |
| | | | 257/432 |
| 2015/0001708 A1 | 1/2015 | Lin | |
| 2016/0026838 A1* | 1/2016 | Gillet | G02B 26/101 |
| | | | 235/462.21 |

OTHER PUBLICATIONS

Office Action and Search Report received for Taiwanese Patent Application No. 105102701, mailed on Dec. 20, 2016, 9 pages including 1 page of English translation.

\* cited by examiner

METHODS OF FORMING INTEGRATED PACKAGE STRUCTURES WITH LOW Z HEIGHT 3D CAMERA

BACKGROUND OF THE INVENTION

As miniaturization advances, there are efforts to construct sensors, such as sensors used in cameras, for use in microelectronic devices, such as laptops, and mobile devices, for example. Such applications may incorporate the use of 3D cameras devices, which can include image sensors, such as a complementary metal on oxide (CMOS) image sensor that may be coupled to an optics module.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
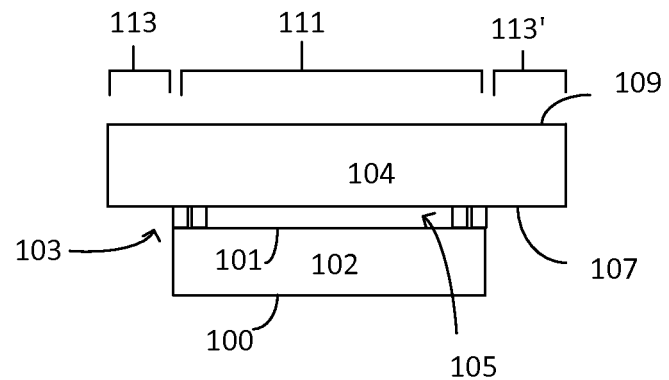
FIGS. 1a-1e represent cross sectional views of structures according to embodiments herein.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as 3D camera structures/devices are described herein. An embodiment may include a first optics module comprising a first sensor die, and a second optics module comprising a second sensor die. The first and second sensor die may be directly coupled to a board. A flexible conductive connector that may be disposed directly on the board, may be located between the first and second optics modules, and may be coupled to both the first and second optics modules.

FIGS. 1a-1e depict cross sectional views of embodiments of camera structures, such as 3D camera structures. In an embodiment, a first side 101 of a die 102, may be coupled with a filter 104, which may comprise an infrared filter 104, in some cases (FIG. 1a). In an embodiment, the filter 104 may comprise a glass material, and may comprise a glass wafer in some embodiments. In an embodiment, the filter 104 may comprise a first side 107 and a second side 109. In an embodiment, the filter 104 may comprise a center portion 111 and two end portions 113, 113', wherein the two end portions 113, 113' are adjacent the coupling connections 103.

In an embodiment, the die 102 may comprise a sensor die 102. In an embodiment, the sensor die 102 may comprise a CMOS sensor die 102, and may be utilized in camera applications, such as 3D camera applications, for example. In an embodiment, the first side 101 of the die 102 may be coupled to the first side 107 of the filter 104, and in some cases the die 104 may be directly coupled to the first side 107 of the filter 104. In an embodiment, the die 102 may comprise a flip chip die 102, and may be coupled to the filter 104 by the use of conductive connections 103. In an embodiment, the conductive connections 103 may comprise solder connections 103, such as ball grid array solder connections, for example. Other type of conductive connections 103 may be used to couple the die 102 to the filter 104, in other embodiments. In an embodiment, a process wherein solder balls comprising a tin silver alloy may connect the die 102 to the filter 104. In another embodiment, non-conductive epoxy may be employed to couple the die 102 to the filter 104. In an embodiment, the conductive connections 103 may provide a seal, such as a hermetic seal, in a region 105 between the die 102 and the filter 104.

Figure 1B:
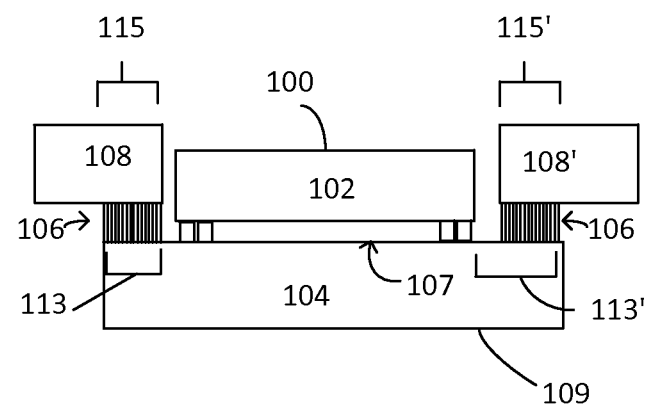

In an embodiment, flexible conductive connectors 108, 108' may be coupled/attached to the first side 107 of the filter 104 (FIG. 1b). In an embodiment, flexible conductive connectors 108, 108' may comprise flexible printed circuit (FPC) connectors 108, 108'. In an embodiment, flexible conductive connectors 108, 108' may comprise end portions 115, 115'. In an embodiment, the end portions 115, 115' of the flexible conductive connectors 108, 108' may be coupled/bonded to the end portions 113, 113' of the filter 104 respectively. In an embodiment, a coupling/bonding material 106 may couple the end portions 115, 115' of the flexible connective connectors 108, 108' with the end portions 113, 113' of the filter 104.

In an embodiment, the coupling/bonding material 106 may comprise an ACF material (anisotropic conductive film). In other embodiments, the coupling/bonding material 106 may comprise a solder material. In an embodiment, the flexible conductive connectors 108, 108' may be coupled/attached to the filter 104 by using a hotbar and/or a reflow process.

Figure 1C:
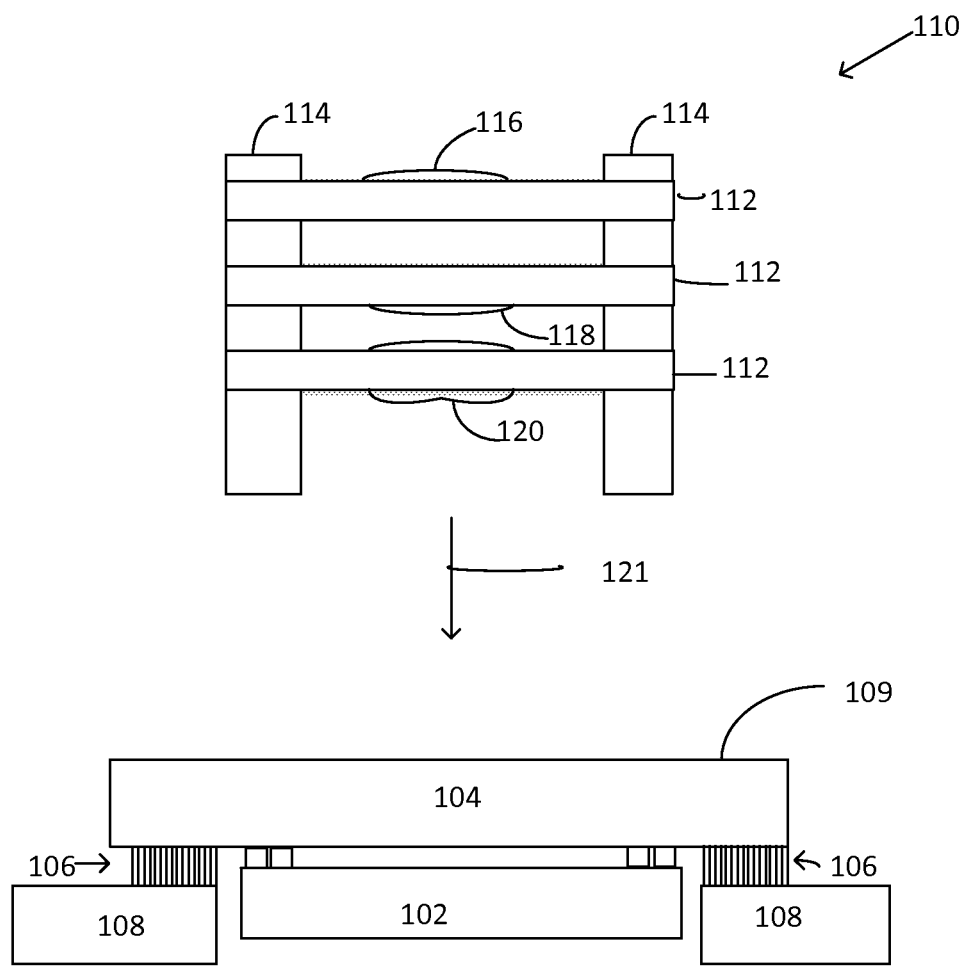
Figure 1D:
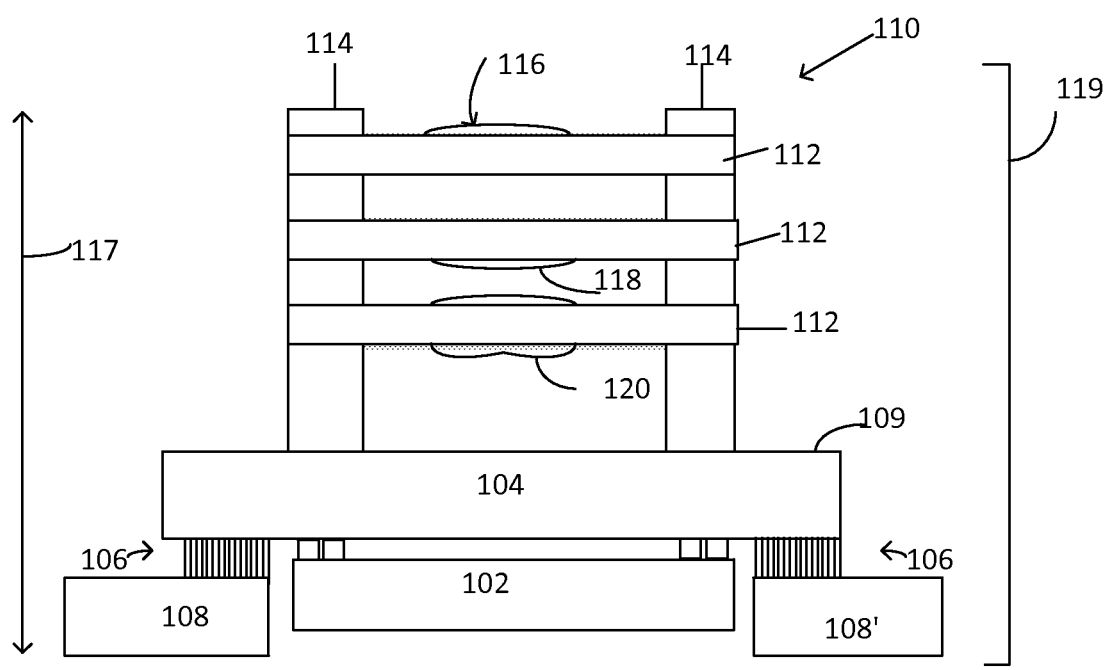

In an embodiment, an optics module 110 may be attached/coupled to the second side 109 of the filter 104 by utilizing an attachment process 121 (FIGS. 1c-1d). In an embodiment, the attachment process 121 may comprise a webcam lens attachment process. In an embodiment, the optics module 110 may comprise such elements as an aperture 116, a bonding layer 118 and a lens 120. The optics module 110 may further comprise glass substrates 112 that may be supported by spacers 114, in an embodiment. The optics module 110 may comprise additional elements as may be required for a particular application. In an embodiment, the optical module 110 may comprise a camera, such as a webcam. In an embodiment, the optics module 110 may comprise a portion of a camera system.

In an embodiment, the optics module 110 may comprise a wafer level packaging optics (WLPO) device, and may be directly coupled to the second side 107 of the filter 104 by using an epoxy material. In an embodiment, the spacers of the optics module 110 may be attached directly to the filter 104. In an embodiment, the optics module 110 that is coupled to the flexible conductive connectors 108, 108' through the filter 104, may comprise a camera, such as a wafer level packaged camera 119. In an embodiment, the camera 119 may comprise a Z height of under about 3 millimeters. In another embodiment, the Z height may comprise less than about 1 millimeter. In other embodiments, the Z height may vary according to the particular application.

Figure 1E:
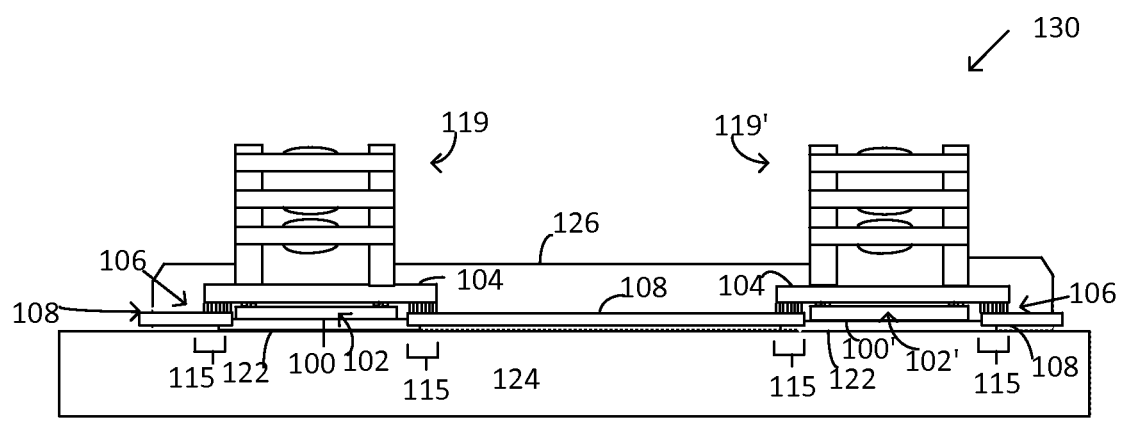

FIG. 1e depicts a portion of a 3D camera module 130, wherein the second side 100 of the first die 102 of a first camera 119 may be attached/bonded to a board 124, and a second side 100' of the second die 104' from a second camera 119' may be attached to the board 124. In an embodiment, the first and second die 102, 102' may be directly attached to the board 124. In an embodiment, the board 124 may comprise a low coefficient of thermal expansion (CTE), wherein the CTE is below about $10 \times 10^{-6}$ $1/°$ C. and may comprise such materials as aluminum nitride, cooper tungsten, Kovar, Invar, aluminum oxide, and aluminum silicon carbide. In an embodiment, the second sides 100, 100' of the first and second die 102, 102' may be bonded/coupled to the board 124 by the use of a bonding material 122, such as an epoxy bonding material 122, although other types of bonding/coupling materials may be used in other embodiments. In an embodiment, a material 126, such as a non-transparent potting material 126, may be disposed on the board 124, and may be disposed adjacent and in between the first and second cameras 119, 119'.

In an embodiment, the flexible conductive connectors 108 may be directly attached to the board 124, and in some cases may be directly bonded to the board 124 with an epoxy material. In other cases, the flexible conductive connectors 108 may be bonded in any other suitable manner to the board 124. In an embodiment, a first side of the flexible conductive connectors 108 may be attached to the filter 104, and a second side opposite the first side may be attached to the board 124. In an embodiment, the terminal ends 115 of the flexible conductive connectors 108 may be disposed on a portion of the bonding material 122 that is disposed on the die 102, 102'. In other cases, the terminal ends 115 are not disposed on a portion of the bonding material 122.

By directly bonding the die to the board 124, thermal resistance is reduced. CMOS temporal noise of the camera module 130 may be reduced to minimal levels in some embodiments. Additionally, the 3D camera module 130 comprises rigid optics with less lens tilt, thus enabling improved image quality and reliability. The camera module 130 is capable of generating three dimensional images for such applications as laptops, mobile devices, game consoles, wearable devices, robots, smart phones, and any other devices utilizing depth detection. The stability of the 3D camera module 130 allows for the relative positions and angles of the two cameras 119, 119' to remain secure, and thus enables accurate 3D sensing.

Figure 2A:
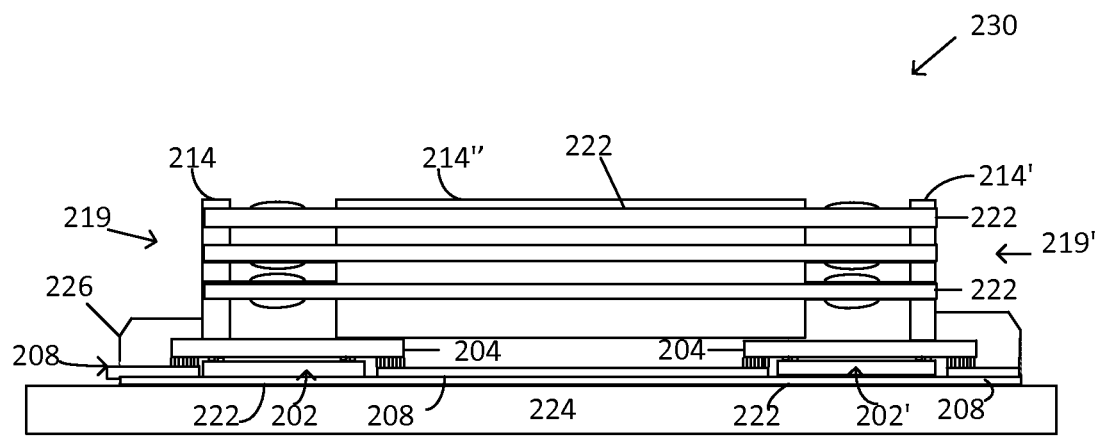
FIGS. 2a-2b represent cross sectional views of structures according to embodiments.

FIG. 2a depicts another embodiment of a 3D camera module 230, similar to the 3D camera module 130 of FIG. 1e, wherein the glass substrates 222 of the optics modules of the cameras 219, 219' extend between the optics modules of the two cameras 219, 219'. In an embodiment, the glass substrates 222 are coupled to the spacers 214, 214' of the optics modules of the cameras 219, 219', and are disposed between the two cameras 219, 219'. An additional spacer 214" is disposed between the two cameras 219, 219', wherein the glass substrates 222 are coupled to/disposed on the additional spacer 214". In an embodiment, the additional spacer 214" may be disposed on a portion of the filters 104, and in other embodiments it may be directly disposed on a portion of the filters 104.

In an embodiment, the die 202, 202' may be directly coupled to a board 224, wherein the board 224 may comprise a thin metal sheet in some cases, but may comprise other materials depending upon the application. The bonding material 222 may comprise an adhesive tape, in an embodiment. In an embodiment, the board 224 may be mechanically decoupled from the filter 204 and lenses of the optical module. In an embodiment material 226, such as a low coefficient of thermal expansion potting material or underfill material 226, may be disposed on the board and may be adjacent the cameras 219, 219'.

Figure 2B:
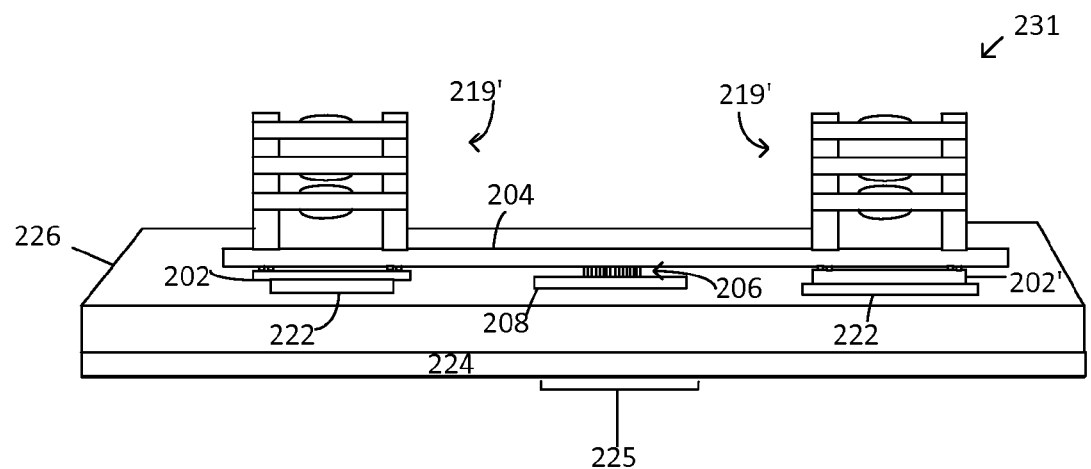

FIG. 2b depicts another embodiment of a camera module 231, similar to the camera module 130 of FIG. 1e. In an embodiment, a single filter 204 may be coupled to both cameras 219, 219'. In an embodiment, the single filter 204 may be coupled with both the die 204, 204' of the cameras 219, 219', and may be disposed between the two cameras 219, 219'. In an embodiment, the single filter 206 may be coupled to a flexible conductive connector 208 that may be disposed between the two cameras 219, 219'. In an embodiment, the flexible conductive connector 208 may be coupled to the single filter 204 by using a bonding material 206, such as an ACF material, for example. In an embodiment, the flexible conductive connector 208 may be disposed on a low CTE material 226. In an embodiment, the low CTE material may be disposed on a board 224, and in some embodiments the board 224 may comprise a Kovar or CuW stiffener. In an embodiment, the flexible conductive connector 208 may be located on a central portion 225 of the board 224, and is not disposed adjacent the center portion 225.

Figure 2C:
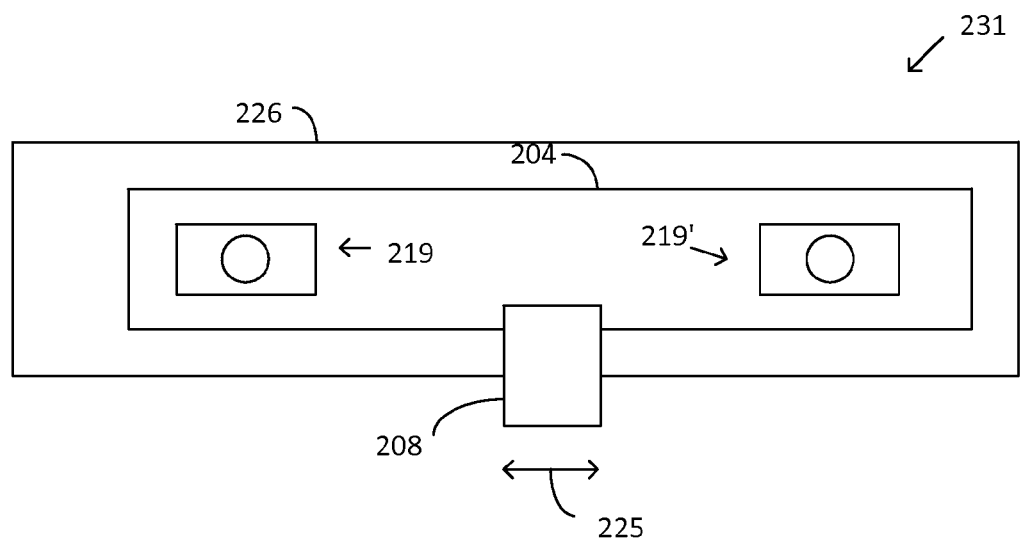
FIG. 2c represents a top view of structures according to embodiments.
Figure 3:
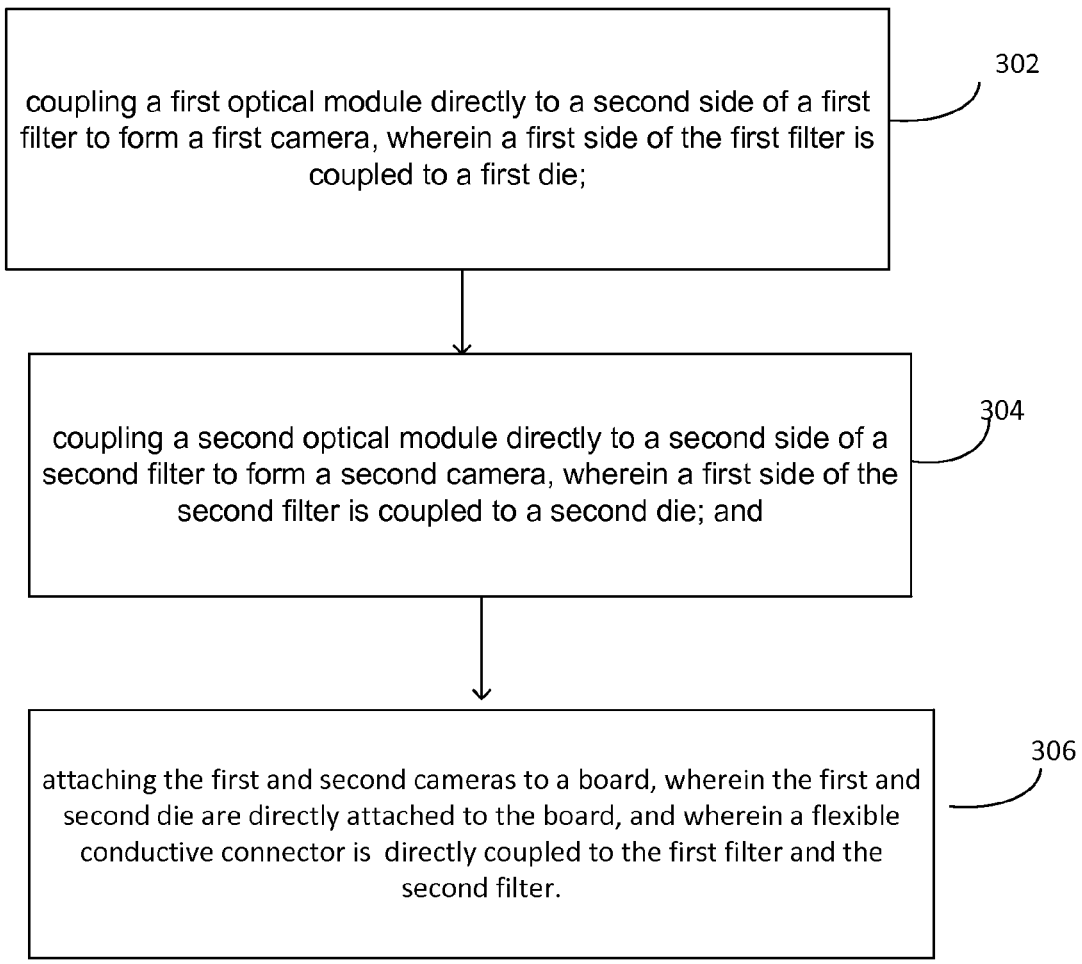
FIG. 3 represents a flow chart of a method according to embodiments.

FIG. 2c depicts a top view of the 3d camera module 231 of FIG. 2b. In an embodiment, the two cameras 219, 219' are coupled to the filter 204, and are disposed on the low CTE material 226. A single flexible conductive connector 208, is coupled to the single filter 204 by a bonding material, such as an ACF material, and is located in a central portion of the low CTE material 226, in an embodiment. The single flexible conductive connector 208 is coupled to both of the cameras 219, 219' through the single filter 204, in an embodiment, FIG. 3 depicts a flow chart of a method of forming a 3D camera module according to an embodiment. At step 302, a first optical module is directly coupled to a second side of a first filter to form a first camera, wherein a first side of the first filter is coupled to a first die. At step 304, a second optical module is directly coupled to a second side of a second filter to form a second camera, wherein a first side of the second filter is coupled to a second die. At step 306, the first and second cameras are attached to a board, wherein the first and second die are directly attached to the board, and wherein a flexible conductive connector is directly coupled to the first filter and the second filter.

In an embodiment, the embodiments of the 3D cameras and 3D camera modules of the embodiments herein may be coupled with any suitable type of package structures capable of providing electrical communications between a microelectronic device, such as a die and a next-level component to which the package structures may be coupled (e.g., a circuit board). In another embodiment, the devices/camera structures herein may be coupled with a package structure that may comprise any suitable type of package structures capable of providing electrical communication between a die and an upper integrated circuit (IC) package coupled with the devices herein.

In various implementations, the 3D camera structures herein may be included in a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder, and wearable devices. In further implementations, the 3D camera structures herein may be included in any other electronic devices that process data.

Figure 4:
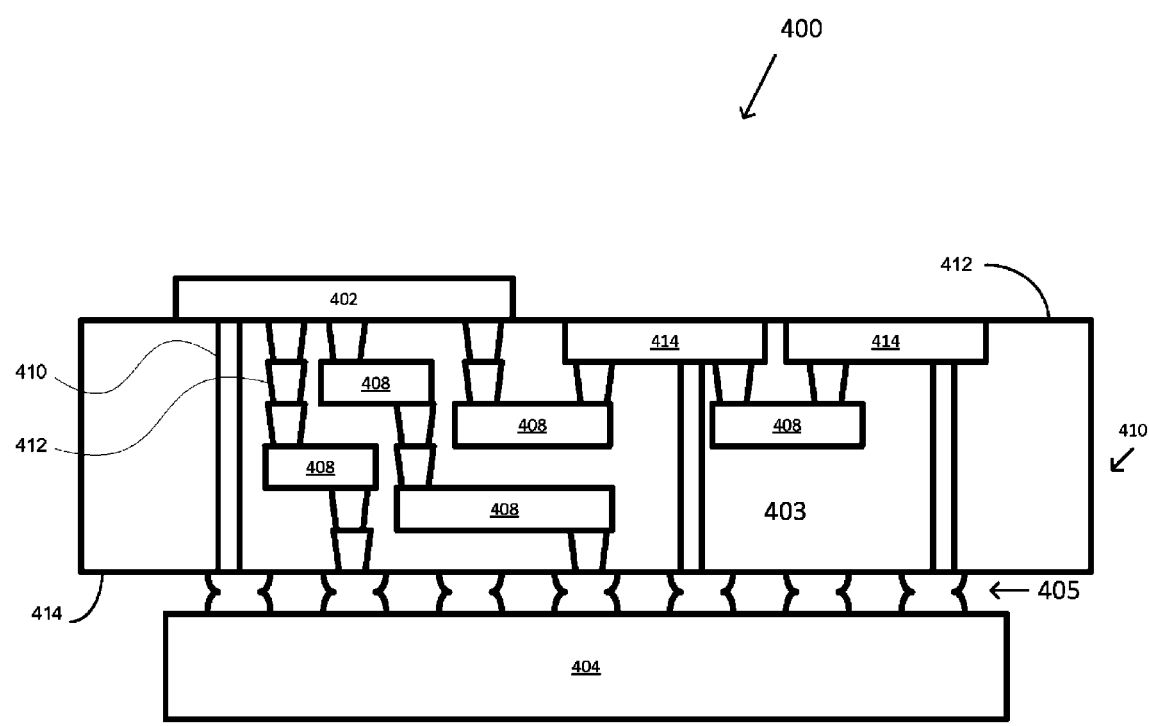
FIG. 4 represents a cross sectional view of an assembly according to embodiments.

Turning now to FIG. 4, illustrated is an embodiment of an assembly 400 according to an embodiment. The assembly 400 includes a number of components disposed on a mainboard 410 or other circuit board. Mainboard 410 includes a first side 412 and an opposing second side 414, and various components may be disposed on either one or both of the first and second sides 412, 414. In an embodiment, the assembly 400 includes a 3D camera module 402 disposed on the mainboard's first side 412, wherein the 3D camera module and may comprise any of the embodiments described herein. Assembly 400 may comprise a portion of any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 410 may comprise any suitable type of circuit board or other substrate capable of providing electrical communication between one or more of the various components disposed on the board. In one embodiment, for example, the mainboard 410 comprises a printed circuit board (PCB) comprising multiple metal layers 408 separated from one another by a layer of dielectric material 403 and interconnected by electrically conductive vias 412, through hole vias 410 and trenches 414. Any one or more of the metal layers may be formed in a desired circuit pattern to route—perhaps in conjunction with other metal layers—electrical signals between the components coupled with the board 410. However, it should be understood that the disclosed embodiments are not limited to the above-described PCB and, further, that mainboard 410 may comprise any other suitable substrate.

In addition to the 3D camera module 402, one or more additional components may be disposed on either one or both sides 412, 414 of the mainboard 410. By way of example, component 402 may be disposed on the first side 412 of the mainboard 410, and component 404 may be disposed on the mainboard's opposing side 414, and may be coupled to the opposing side 414 by solder interconnect structures 405. Additional components that may be disposed on the mainboard 410 include other microelectronic devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the assembly 400 includes a radiation shield. In a further embodiment, the assembly 400 includes a cooling solution. In yet another embodiment, the assembly 400 includes an antenna. In yet a further embodiment, the assembly 400 may be disposed within a housing or case. Where the mainboard 410 is disposed within a housing, some of the components of assembly 400—e.g., a user interface device, such as a display or keypad, and/or a power supply, such as a battery—may be electrically coupled with the mainboard 410 (and/or a component disposed on this board) but may be mechanically coupled with the housing.

Figure 5:
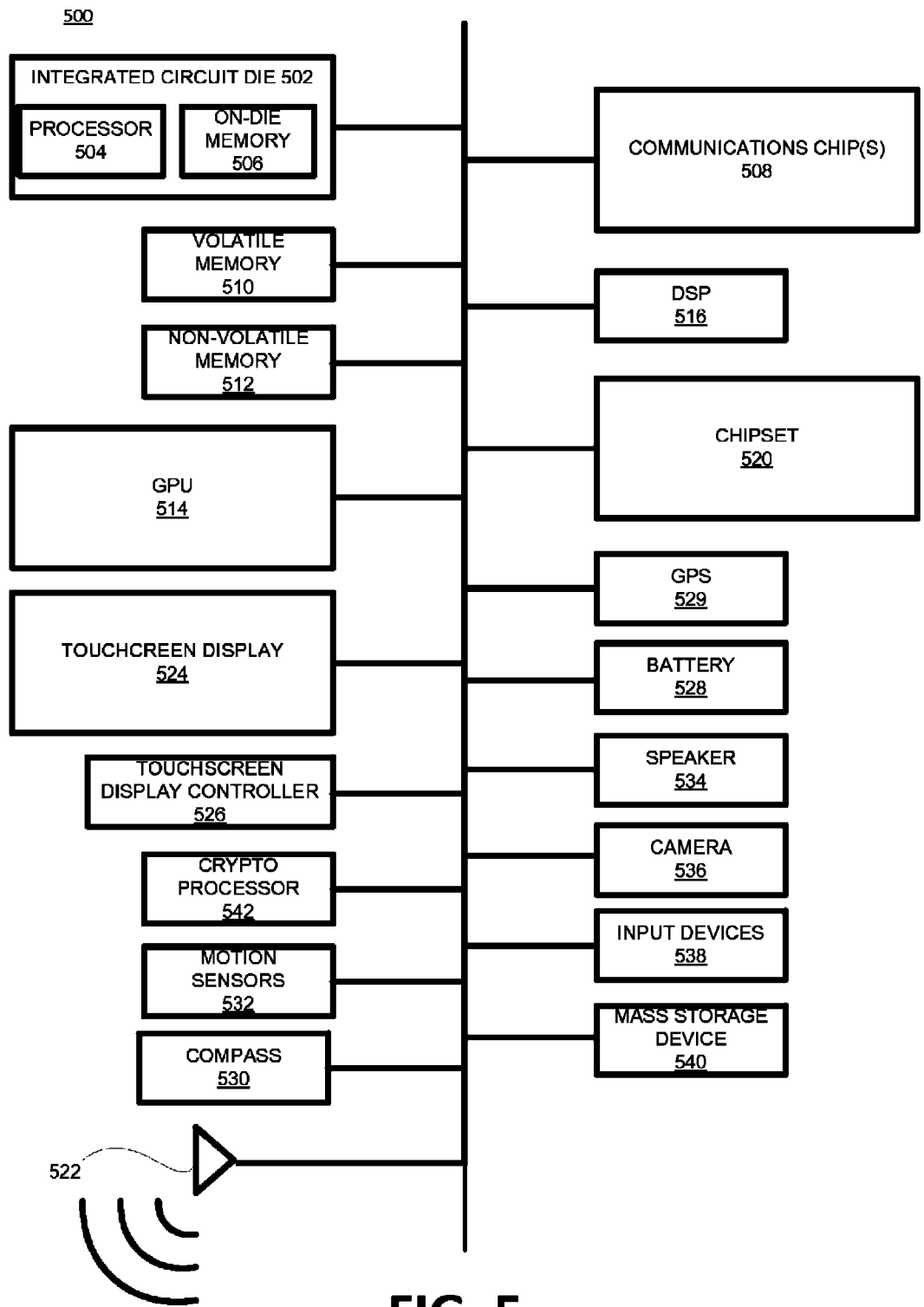
FIG. 5 represents a system according to embodiments.

FIG. 5 is a schematic of a computing device/system 500 according to embodiments included herein. The computing device 500 may include a number of components. In an embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 529, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some s they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as transistors or metal interconnects, that are formed in accordance with embodiments herein. The term "processor" may refer to any device or portion of a device that processes electronic data from registers and/or memory to transform that electronic data into other electronic data that may be stored in registers and/or memory.

The communication chip 508 may also include one or more devices, such as transistors device structures and package structures, that are formed in accordance with embodiments herein. In further embodiments, another component housed within the computing device 500 may contain one or more devices, such as transistors device structures and associated package structures that are formed in accordance with embodiments herein.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic structure comprising:
a first filter comprising a first side and a second side;
at least one conductive interconnect structure directly disposed on the first side of the first filter;
a first side of a first die directly coupled to the at least one conductive interconnect structure, wherein the at least one conductive interconnect structure is directly on the first side of the first filter and is directly on the first side of the first die, and wherein the first die is disposed in a center portion of the first side of the filter, and is not disposed in an end portion of the first filter;
a flexible conductive connector directly coupled to an end portion of the first side of the first filter, wherein the first side of the first filter is disposed directly on the flexible conductive connector; and
a first optics module disposed directly on the second side of the first filter.

2. The structure of claim 1 further comprising wherein the flexible conductive connector is directly coupled with a board, and wherein a second side of the first die is directly coupled to the board, wherein the board comprises a low coefficient of thermal expansion.

3. The structure of claim 1 wherein the first die comprises a CMOS image sensor die, and comprises a portion of a 3D camera.

4. The structure of claim 2 further comprising wherein the first die is directly coupled to the board with an epoxy material.

5. The structure of claim 3 wherein the 3D camera module comprises a Z height below about 3 millimeters.

6. The structure of claim 2 further comprising wherein an end portion of the flexible conductive connector is directly coupled with a second filter, wherein the second filter is coupled with a second optics module.

7. The structure of claim 6 further comprising wherein the second optics module comprises a second die directly coupled to the board.

8. The structure of claim 6 further comprising wherein the flexible conductive connector is disposed between the first optics module and the second optics module, and is disposed on the board.

9. A 3D camera module comprising:
a board;
a first optics module and a second optics module disposed on the board, wherein the first and second optics modules are adjacent one another;
a first sensor die coupled to the first optics module and a second sensor die coupled to the second optics module, wherein the first and second sensor die are directly coupled to the board; and
a flexible conductive connector coupled to both the first and second optics modules, wherein the first optics module is disposed on filter, wherein a first side of the filter is disposed directly on a first side of the first sensor die, and wherein the first side of the filter is disposed directly on the flexible conductive connector.

10. The structure of claim 9 wherein a first end portion of the flexible conductive connector is disposed directly on the filter that is coupled to the first sensor die, and wherein a second end portion of the flexible conductive connector is disposed directly on a second filter that is coupled to the second sensor die.

11. The structure of claim 10 further comprising wherein at least one glass substrate is disposed between the first and second optics modules, and extends across the first and second optics modules.

12. The structure of claim 11 wherein the glass substrate is disposed on a spacer material located between the first and second optical modules.

13. The structure of claim 10 wherein the filter comprises an infrared filter, and at least one of the first and second sensor die comprises a CMOS image sensor die.

14. The structure of claim 9 wherein the filter comprises a single infrared filter that is disposed between the first and second optics modules, and is coupled to both the first and second optics modules.

15. The structure of claim 14 further comprising wherein the single infrared filter is coupled with the flexible conductive connector, wherein the flexible conductive connector is disposed on a center portion of the board.

16. The structure of claim 9 further comprising a system comprising: a communication chip communicatively coupled to the camera module; and a DRAM communicatively coupled to the communication chip.

17. The structure of claim 13 further comprising wherein the filter comprises a first infrared filter, wherein a first end portion of the flexible conductive connector is coupled to the first infrared filter that is disposed between the first optics module and the first sensor die, and wherein a second end portion of the flexible conductive connector is coupled to a second infrared filter that is disposed between the second optics module and the second sensor die.

18. The structure of claim 17 wherein the flexible conductive connector is coupled to the first and second infrared filters by one of an ACF material or a solder material.

19. A method of forming a 3D camera module, comprising:
coupling a first optical module directly to a second side of a first filter to form a first camera, wherein a first side of the first filter is attached directly on a first die;
coupling a second optical module directly to a second side of a second filter to form a second camera, wherein a first side of the second filter is attached directly on a second die; and
attaching the first and second cameras to a board, wherein the first and second die are directly attached to the board, and wherein a flexible conductive connector is attached directly on the first side of the first filter and is attached directly on the first side of the second filter.

20. The method of claim 19 further comprising wherein the first and second die comprise a CMOS image sensor device.

21. The method of claim 19 further comprising wherein the first and second cameras comprises a Z height below about 3 millimeters.

22. The method of claim 19 further comprising wherein the board comprises a low CTE substrate.

23. The method of claim 19 further comprising wherein the first and second die are directly bonded to the board with solder connective structures.

24. The method of claim 1 further comprising wherein the first and second filters comprise infrared filters, and are directly coupled to the flexible conductive connector with a coupling material selected from the group consisting of ACF and solder.

* * * * *